United States Patent
Ge et al.

(10) Patent No.: US 11,456,188 B2
(45) Date of Patent: Sep. 27, 2022

(54) METHOD OF MAKING FLEXIBLE SEMICONDUCTOR DEVICE WITH GRAPHENE TAPE

(71) Applicant: NXP USA, INC., Austin, TX (US)

(72) Inventors: You Ge, Tianjin (CN); Meng Kong Lye, Shah Alam (MY); Zhijie Wang, Tianjin (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/874,196

(22) Filed: May 14, 2020

(65) Prior Publication Data

US 2020/0312751 A1 Oct. 1, 2020

Related U.S. Application Data

(62) Division of application No. 15/365,549, filed on Nov. 30, 2016, now Pat. No. 10,692,802.

(51) Int. Cl.
*H01L 21/56* (2006.01)
*H01L 23/498* (2006.01)
(Continued)

(52) U.S. Cl.
CPC .......... *H01L 21/56* (2013.01); *H01L 21/4853* (2013.01); *H01L 21/563* (2013.01); *H01L 21/568* (2013.01); *H01L 21/6835* (2013.01); *H01L 23/3121* (2013.01); *H01L 23/3672* (2013.01); *H01L 23/3736* (2013.01); *H01L 23/4985* (2013.01); *H01L 23/49572* (2013.01); *H01L 23/49579* (2013.01); *H01L 23/562* (2013.01); *H01L 23/13* (2013.01); *H01L 23/36* (2013.01); *H01L 24/13* (2013.01); *H01L 24/16* (2013.01); *H01L 24/32* (2013.01);
(Continued)

(58) Field of Classification Search
CPC ..... H01L 21/56; H01L 21/563; H01L 21/568; H01L 21/6835; H01L 21/4853; H01L 21/566; H01L 21/4871; H01L 21/6836; H01L 23/49572; H01L 23/4985; H01L 23/3121; H01L 23/3672; H01L 23/3736; H01L 23/49579; H01L 23/562; H01L 2224/13101; H01L 2924/15173; H01L 2924/07811; H01L 2924/15162; H01L 24/13; H01L 24/83; H01L 2224/83851; H01L 23/13; H01L 2224/83856; H01L 2224/2929; H01L 2924/07802; H01L 2224/83192; H01L 23/36; H01L 24/16; H01L 24/32; H01L 24/73; H01L 2224/16227; H01L 2224/29099; H01L 2224/32225; H01L 2224/73204; H01L 2924/0781; H01L 23/31; H01L 23/3107
See application file for complete search history.

(56) References Cited

U.S. PATENT DOCUMENTS

| | | | |
|---|---|---|---|
| 10,319,890 B2 * | 6/2019 | Tischler | H01L 25/0655 |
| 2005/0112800 A1 * | 5/2005 | Yamano | H01L 23/3114 438/113 |
| 2017/0069796 A1 * | 3/2017 | Lin | H01L 24/08 |

* cited by examiner

Primary Examiner — Shouxiang Hu

(57) ABSTRACT

A flexible semiconductor device includes a first tape having bonding pads and conductive traces formed. A semiconductor die having a bottom surface is attached to the first tape and electrically connected to the bond pads by way of electrical contacts. A second tape is attached to a top surface of the semiconductor die. The first and second tapes encapsulate the semiconductor die, the electrical contacts, and at least a part of the conductive traces.

20 Claims, 15 Drawing Sheets

(51) Int. Cl.
  *H01L 21/683* (2006.01)
  *H01L 21/48* (2006.01)
  *H01L 23/31* (2006.01)
  *H01L 23/367* (2006.01)
  *H01L 23/373* (2006.01)
  *H01L 23/495* (2006.01)
  *H01L 23/00* (2006.01)
  H01L 23/13 (2006.01)
  H01L 23/36 (2006.01)

(52) U.S. Cl.
  CPC .............. *H01L 24/73* (2013.01); *H01L 24/83* (2013.01); *H01L 2224/13101* (2013.01); *H01L 2224/16227* (2013.01); *H01L 2224/2929* (2013.01); *H01L 2224/29099* (2013.01); *H01L 2224/32225* (2013.01); *H01L 2224/73204* (2013.01); *H01L 2224/83192* (2013.01); *H01L 2224/83851* (2013.01); *H01L 2224/83856* (2013.01); *H01L 2924/0781* (2013.01); *H01L 2924/07802* (2013.01); *H01L 2924/07811* (2013.01); *H01L 2924/15162* (2013.01); *H01L 2924/15173* (2013.01)

METHOD OF MAKING FLEXIBLE SEMICONDUCTOR DEVICE WITH GRAPHENE TAPE

This application is a divisional application of a U.S. patent application entitled "FLEXIBLE SEMICONDUCTOR DEVICE WITH GRAPHENE TAPE", having a serial number of Ser. No. 15/365,549, having a filing date of Nov. 30, 2016, having common inventors, and having a common assignee, all of which is incorporated by reference in its entirety.

BACKGROUND

The present invention relates to semiconductor device assembly and, more particularly, to a flexible semiconductor device assembled with a graphene tape.

With the expansion of the wearable device market, the demand for low cost, flexible semiconductor packages has gotten stronger. Conventional semiconductor packages assembled with encapsulant materials like plastic or ceramic are very rigid, which results in low flexibility and thus they are not ideal for wearable devices.

It would be advantageous to have a method and materials for assembling low cost, flexible devices.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
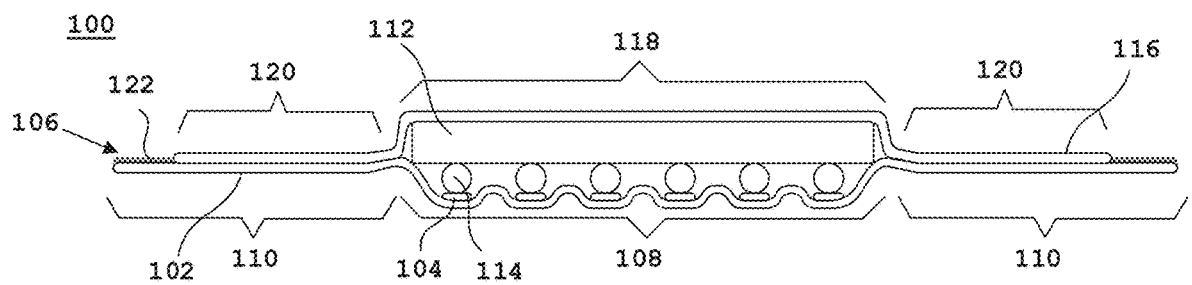
FIGS. 1-5 are cross-sectional side views of various flexible semiconductor devices in accordance with embodiments of the present invention.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a semiconductor device including a first tape that has a plurality of bonding pads and a plurality of conductive traces formed thereon, wherein the plurality of bonding pads are formed in a first center area of the first tape, and the plurality of conductive traces are formed in the first center area and extend from the plurality of bonding pads to a first peripheral area surrounding the first center area. The semiconductor device further includes a first semiconductor die attached to the first tape and electrically connected to the plurality of bond pads by way of a plurality of electrical contacts, and a second tape having a second center area attached to the first semiconductor die, and a second peripheral area surrounding the second center area attached to the first peripheral area of the first tape, wherein the first and second tape encapsulate the first semiconductor die, the plurality of electrical contacts, and at least a part of the plurality of conductive traces.

In a further embodiment, the present invention provides a method for assembling a semiconductor device. The method includes providing a first tape that has a plurality of bonding pads and a plurality of conductive traces formed thereon, wherein the plurality of bonding pads are formed in a first center area of the first tape, and the plurality of conductive traces are formed in the first center area and extend from the plurality of bonding pads to a first peripheral area surrounding the first center area. The method further includes attaching at least a first semiconductor die to the first tape and electrically connected to the plurality of bond pads by way of a plurality of electrical contacts, and attaching a second center area of a second tape to the first semiconductor die and a second peripheral area surrounding the second center area to the first peripheral area of the first tape, wherein the first and second tape encapsulate the first semiconductor die, the plurality of electrical contacts, and at least a part of the plurality of conductive traces.

Referring now to FIG. 1, a cross-sectional side view of a semiconductor device 100 in accordance with a first embodiment of the present invention is shown. The semiconductor device 100 includes a first tape 102 having a plurality of bonding pads 104 and a plurality of conductive traces 106 formed thereon. The plurality of bonding pads 104 are formed in a first center area 108 of the first tape 102, and the plurality of conductive traces 106 are formed in the first center area 108 and extend from the plurality of bonding pads 104 to a first peripheral area 110 that surrounds the first center area 108. In a preferred embodiment, the plurality of conductive traces 106 and the plurality of bonding pads 104 comprises graphene.

The semiconductor device 100 further includes a first semiconductor die 112 having a bottom surface attached to the first tape 102 and electrically connected to the plurality of bond pads 104 by way of a plurality of electrical contacts 114, and a second tape 116 having a second center area 118 attached to a top surface of the first semiconductor die 112, and a second peripheral area 120, that surrounds the second center area 118, attached to the first peripheral area 110 of the first tape 102. The plurality of electrical contacts 114 are solder balls or solder bumps, that are attached to the bottom surface of the first semiconductor die 112 by controlled collapse chip connection (C4) process. The first and second tapes 102 and 116 encapsulate the first semiconductor die 112, the plurality of electrical contacts 114, and at least a part of the plurality of conductive traces 106. In a preferred embodiment, a vacuum is applied between the first and second tapes 102 and 116 to draw the first and second tapes 102 and 116 together. The plurality of electrical contacts 114 are attached to the plurality of bonding pads 104 by air pressure. In a preferred embodiment, the first and second peripheral areas 110 and 120 are attached to each other by way of adhesive materials disposed therebetween. In another preferred embodiment, the first and second peripheral areas 110 and 120 are heated and attached to each other. In a preferred embodiment, at least one of the plurality of conductive traces 106 has a portion 122 exposed from the second tape 120 such that the exposed portion 122 of the at least one of the plurality of conductive traces 106 acts as an input and output terminal of the semiconductor device 100.

Figure 2:
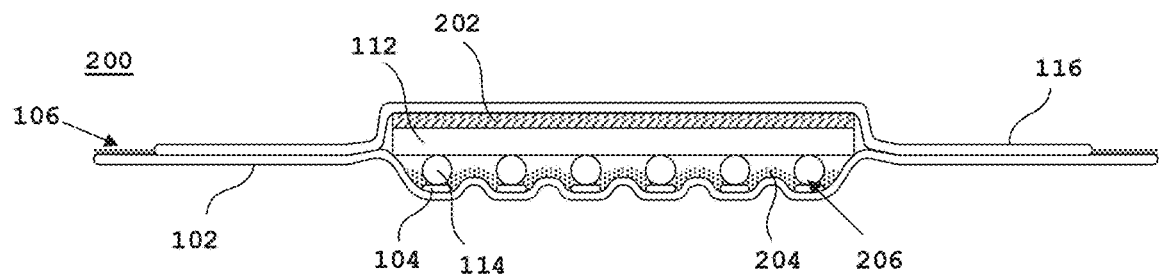

FIG. 2 shows a cross-sectional side view of a semiconductor device 200 in accordance with a second embodiment of the present invention. The second embodiment is similar to the first embodiment described above, except that the semiconductor device 200 further includes a metal plate 202 disposed between the first semiconductor die 112 and the second tape 116 that protects the first semiconductor die 112 from being bent, and a horizontally non-conductive layer 204 disposed between the first tape 102 and the first semiconductor die 112 that locks the plurality of electrical contacts 114 in place to prevent shifting between the plurality of electrical contacts 114 and the plurality of bonding pads 104. In a preferred embodiment, the horizontally non-conductive layer 204 has a thickness ranging from 10 m to 50 m. The horizontally nonconductive layer 204 preferably comprises adhesive material such as anisotropic conductive film or B-stage epoxy. In a preferred embodiment, the horizontally non-conductive layer 204 comprises a plurality of openings 206 corresponding to the plurality of bond pads 104, wherein the plurality of electrical contacts 114 are physically and electrically connected to the plurality of bond pads 104 through the plurality of openings 206.

Figure 3:
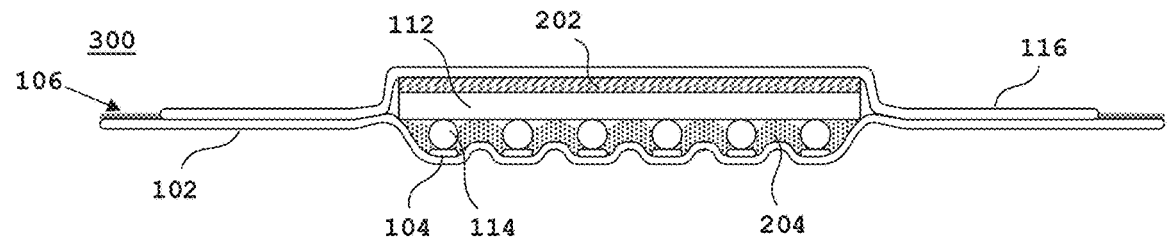

FIG. 3 shows a cross-sectional side view of a semiconductor device 300 in accordance with a third embodiment of the present invention. The third embodiment is similar to the second embodiment described above, except that the horizontally non-conductive layer 204 at least partially contacts the bottom surface of the first semiconductor die 112 due to the vacuum applied between the first and second tapes 102 and 116. In another preferred embodiment, the horizontally nonconductive layer 204 fills the gap between the first semiconductor die 112 and the first tape 102.

Figure 4:
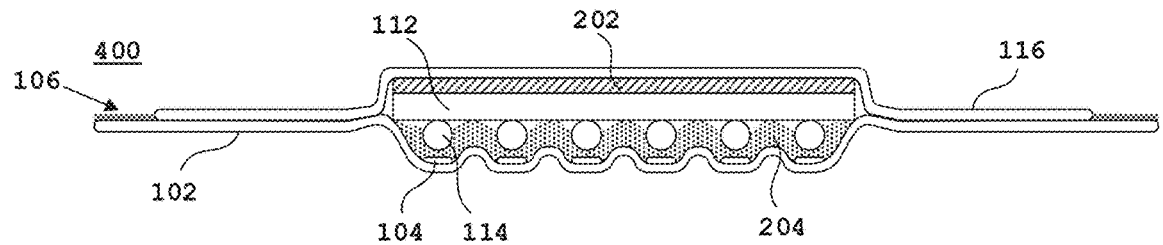

FIG. 4 shows a cross-sectional side view of a semiconductor device 400 in accordance with a fourth embodiment of the present invention. The fourth embodiment is similar to the third embodiment described above, except that the horizontally non-conductive layer 204 comprises an anisotropic conductive film that is conductive only in a vertical direction by the air pressure in the vertical direction. In a preferred embodiment, the horizontally non-conductive layer 204 is disposed between the first tape 102 and the plurality of electrical contacts 114 and electrically connects the plurality of bond pads 104 to the plurality of electrical contacts 114. In a preferred embodiment, the plurality of electrical contacts 114 are at least partially pressed into the horizontally nonconductive layer 204 by air pressure, such that the horizontally non-conductive layer 204 locks the plurality of electrical contacts 114 in place to prevent shifting between the plurality of electrical contacts 114 and the plurality of bonding pads 104.

Figure 5:
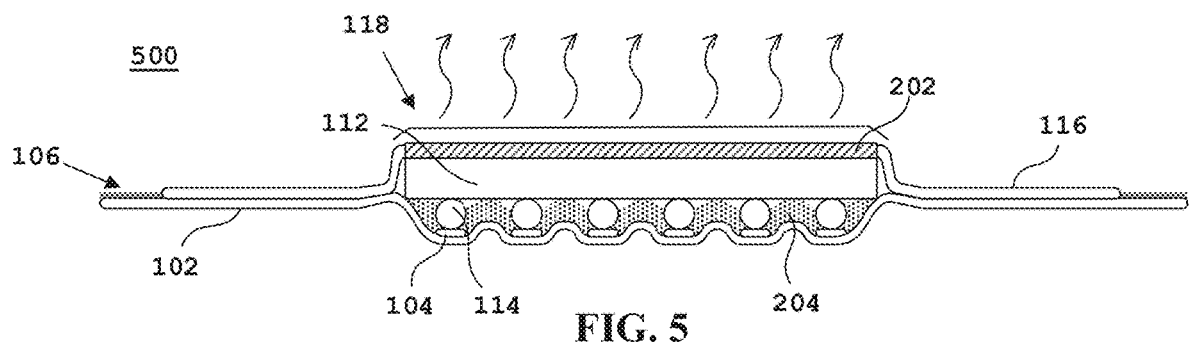
Figure 6:
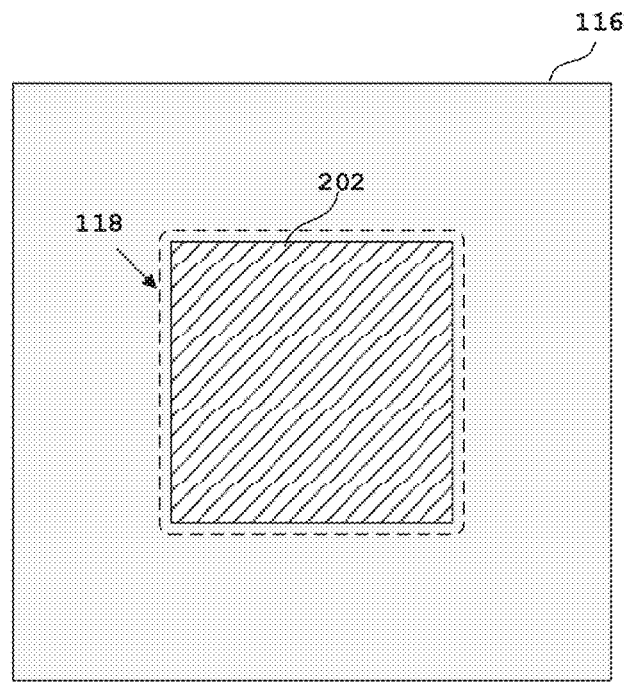
FIG. 6 is a top plan view of a second tape of the semiconductor device of FIG. 5 in accordance with an embodiment of the present invention.

FIG. 5 shows a cross-sectional side view of a semiconductor device 500 in accordance with a fifth embodiment of the present invention. The fifth embodiment is similar to the third embodiment described above, except that the metal plate 202 is embedded within the second center area 118 of the second tape 116 and exposed from the second tape 116 to achieve better heat dissipation. FIG. 6 is a top plan view of the second tape 116 and the metal plate 202 of FIG. 5 in accordance with the fifth embodiment of the present invention, which shows that the metal plate 202 is embedded within the second center area 118 of the second tape 116 and exposed from the second tape 116.

Figure 7:
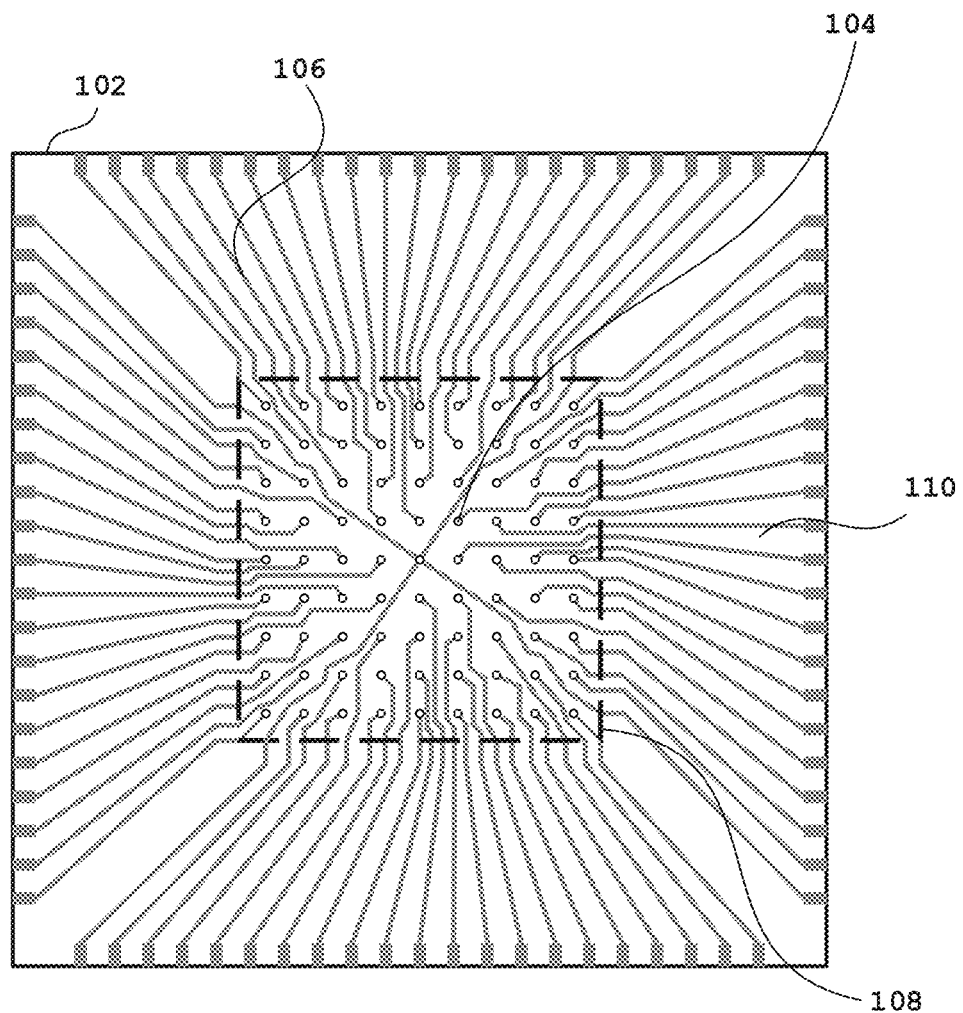
FIG. 7 is a top plan view of a graphene tape of the semiconductor devices of FIGS. 1-5 in accordance with an embodiment of the present invention.

FIG. 7 is a top plan view of the first tape 102 of FIGS. 1-5 in accordance with an embodiment of the present invention. The first tape 102 includes a plurality of bonding pads 104 and a plurality of conductive traces 106 formed thereon. The plurality of bonding pads 104 are formed in a first center area 108 of the first tape 102, and the plurality of conductive traces 106 are formed in the first center area 108 and extend from the plurality of bonding pads 104 to a first peripheral area 110 that surrounds the first center area 108. In a preferred embodiment, the plurality of conductive traces 106 are graphene traces.

Figure 8:
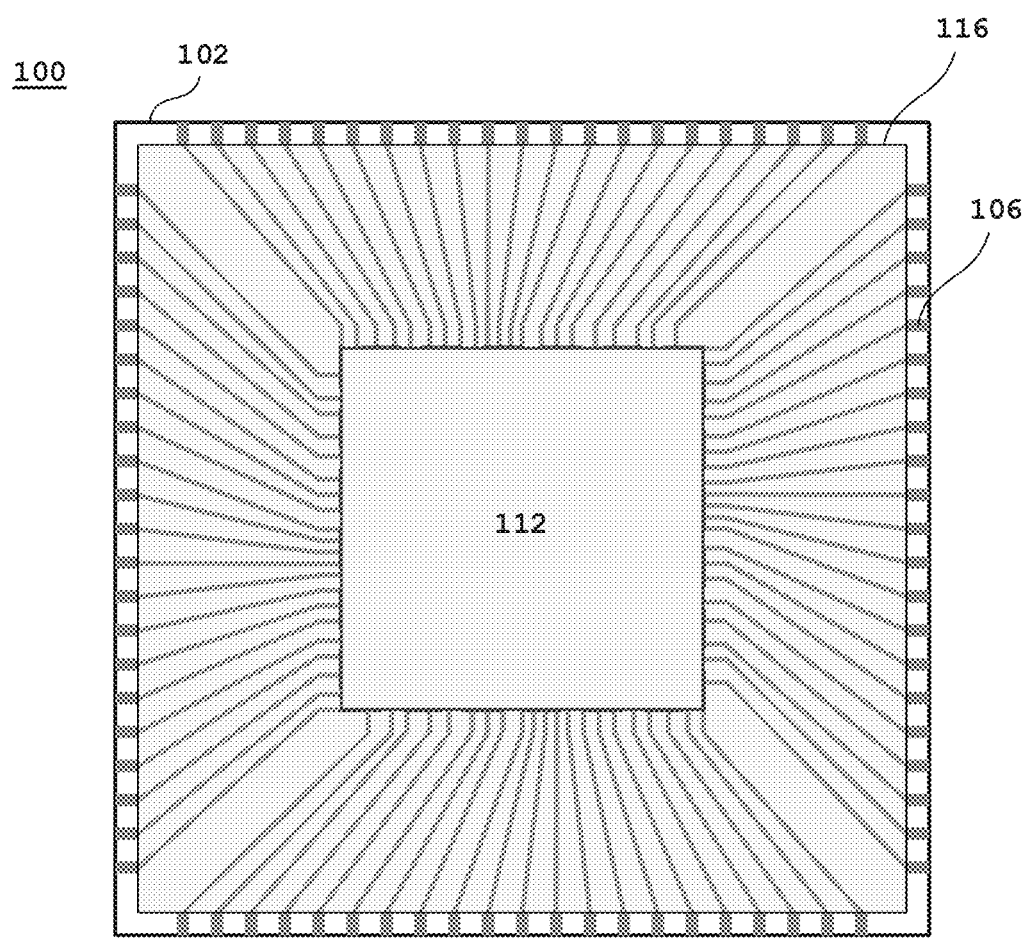
FIGS. 8-10 are top plan views of a flexible semiconductor device in accordance with embodiments of the present invention.
Figure 9:
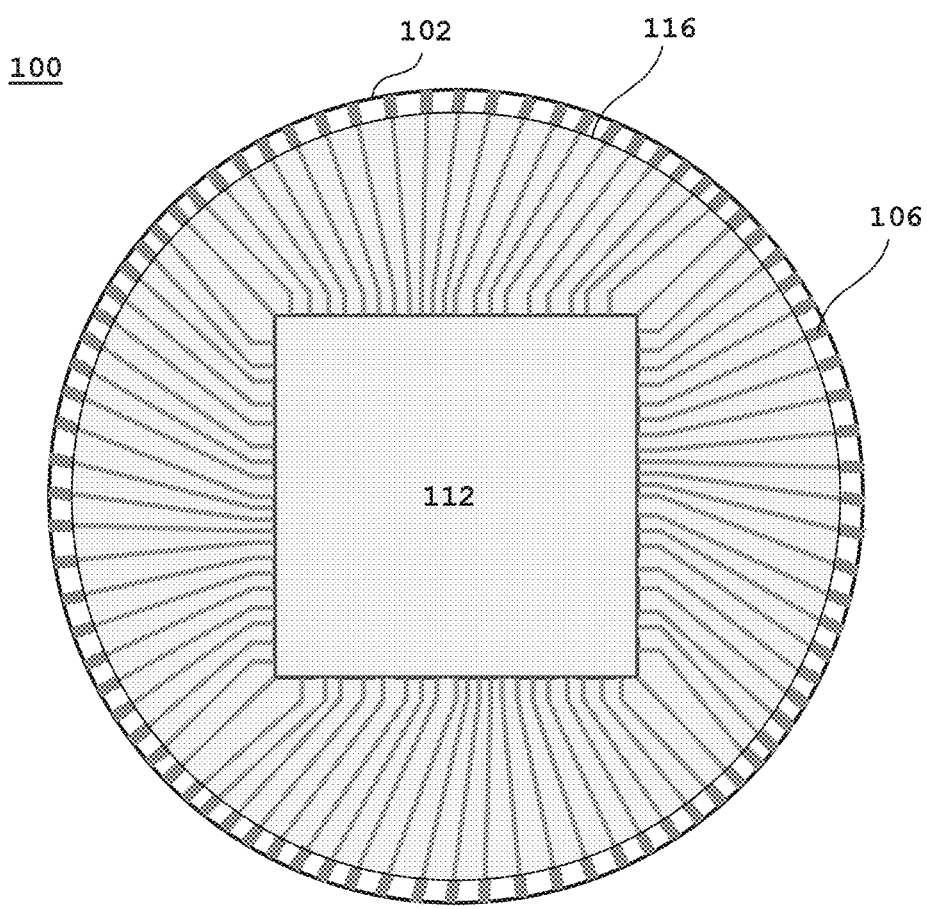

FIG. 8 is a top plan view of the semiconductor device 100 in accordance with an embodiment of the present invention. As shown in FIG. 8, the semiconductor device 100 has a rectangular profile. FIG. 9 is a top plan view of the semiconductor device 100 in accordance with another embodiment of the present invention. As shown in FIG. 9, the semiconductor device 100 has a round profile.

Figure 10:
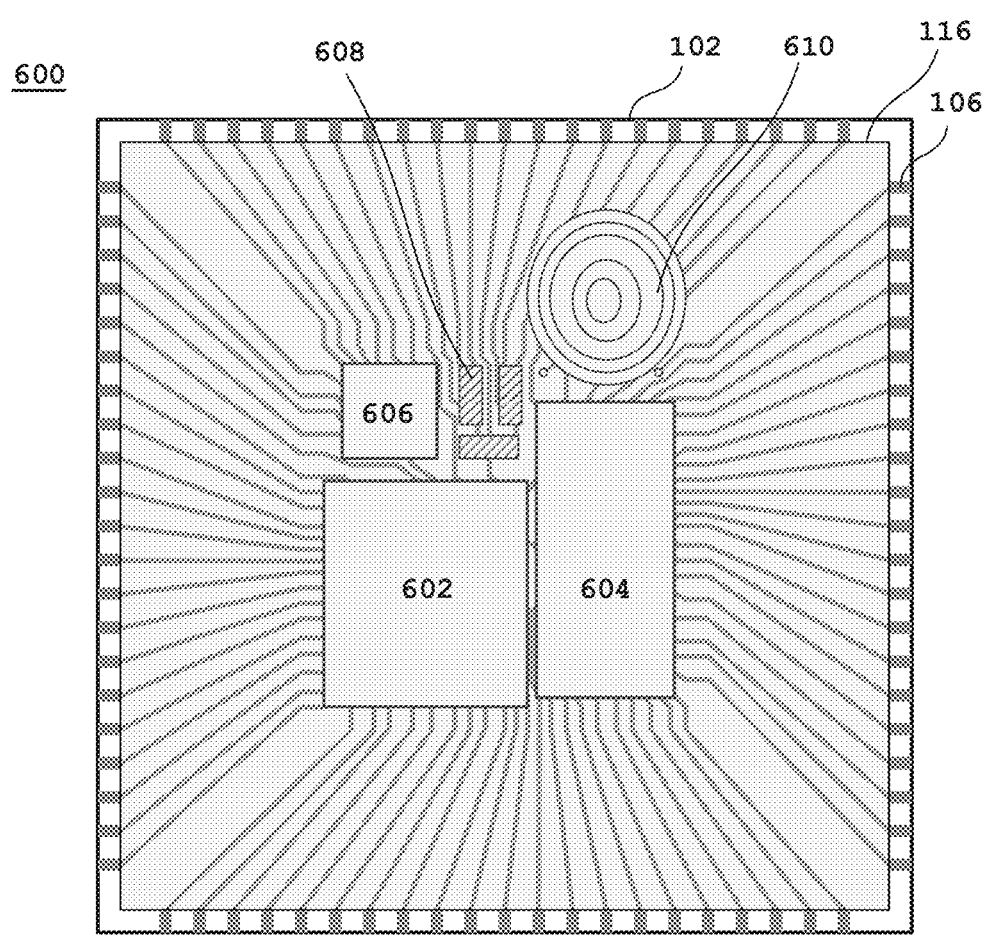

FIG. 10 is a top plan view of a semiconductor device 600 in accordance with yet another embodiment of the present invention. The embodiment shown in FIG. 10 is similar to the embodiment shown in FIG. 8 described above, except that there are multiple semiconductor dies 602-606 attached to the first tape 102 and electrically connected to the conductive traces 106 formed on the first tape 102. In a preferred embodiment, the multiple semiconductor dies 602-606 includes function dies such as a micro-controller unit, sensor dies, radio frequency (RF) dies, etc. The conductive traces 106 are preferably only provided for electrically connecting the multiple semiconductor dies 602-606 and are entirely encapsulated by the first and second tapes 102 and 116 given that the semiconductor device 600 being a self-contained system. In a preferred embodiment, the semiconductor device 600 includes at least one passive device 608 formed on the first tape 102. In another preferred embodiment, the semiconductor device 600 further includes at least one coil 610, wherein the coil 610 is preferably formed by graphene traces. In a preferred embodiment, the multiple semiconductor dies 602-606, the at least one passive device 608 and the coil 610 are electrically connected to each other by way of the plurality of conductive traces 106 to operate together as a system in the semiconductor device 600.

FIGS. 11-16 are a series of diagrams illustrating the steps in assembling or packaging a semiconductor device with the first tape 102 that has a plurality of bonding pads 104 and a plurality of conductive traces 106 formed thereon in accordance with an embodiment of the present invention. The plurality of bonding pads 104 are formed in a first center area 108 of the first tape 102, and the plurality of conductive traces 106 are formed in the first center area 108 and extend from the plurality of bonding pads 104 to a first peripheral area 110 that surrounds the first center area 108.

Figure 11:
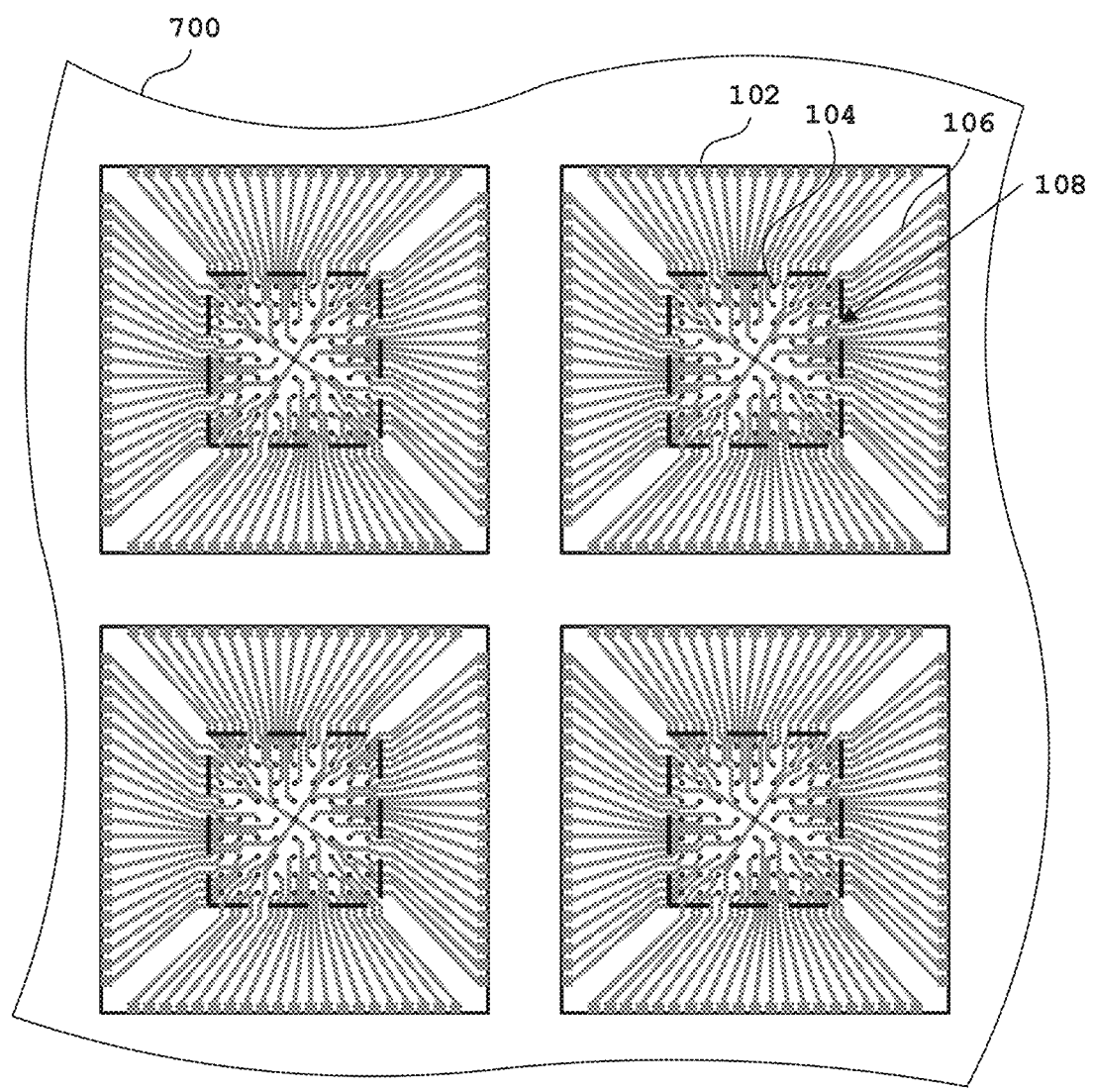
FIGS. 11-13, 14A, 14B, 15A, 15B, 16A, 16B, and 17 are a series of diagrams illustrating steps in assembling a flexible semiconductor device in accordance with an embodiment of the present invention.

Starting from FIG. 11, an array 700 of the first tapes 102 is provided. In a preferred embodiment, each first tape 102 has a plurality of bonding pads 104 and a plurality of conductive traces 106 formed thereon. In a preferred embodiment, the array 700 of the first tapes 102 is provided in a single piece of tape. In a preferred embodiment, the plurality of conductive traces 106 and the plurality of bonding pads 104 comprises graphene.

Figure 12:
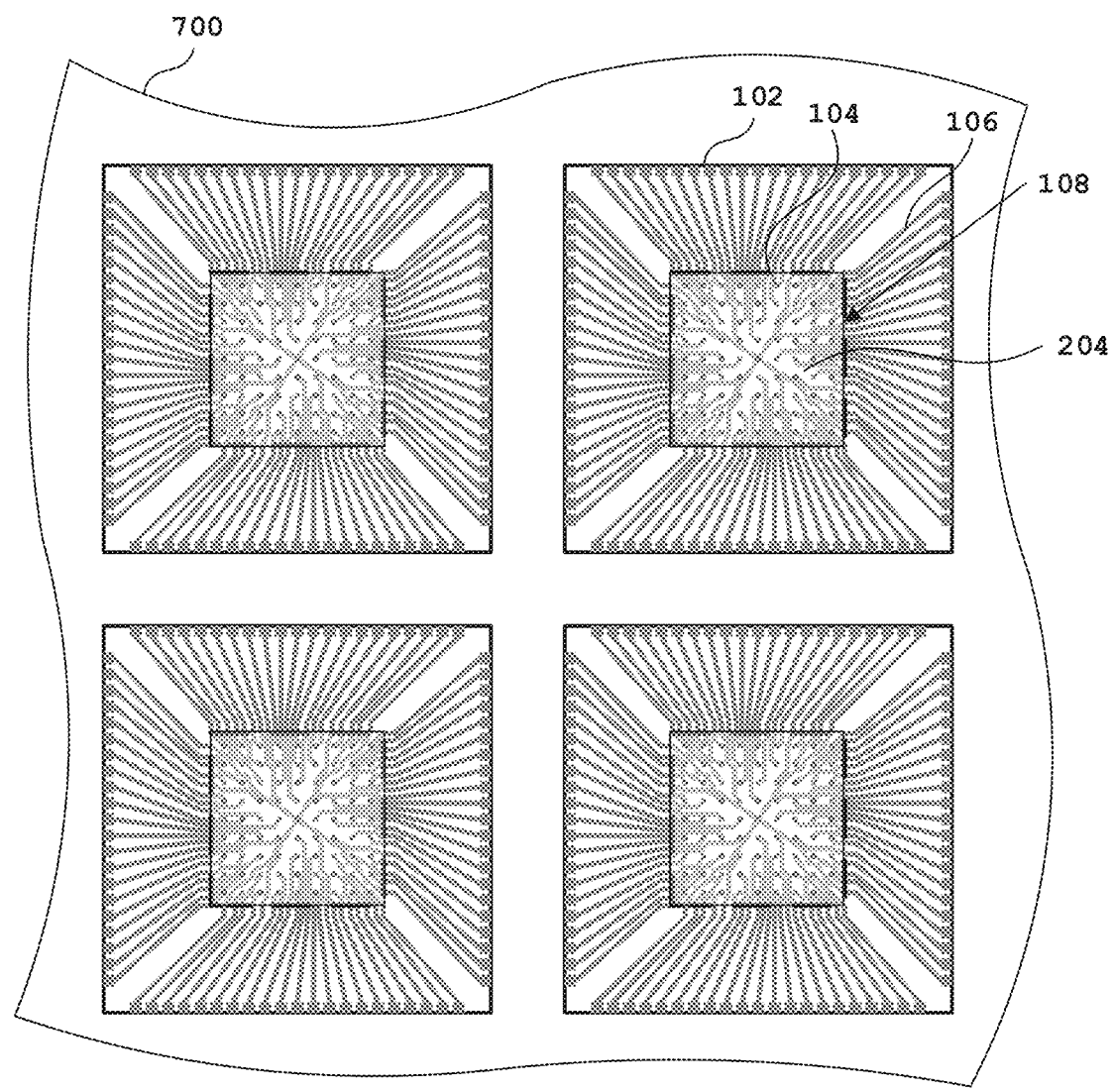

In the next step illustrated in FIG. 12, a horizontally non-conductive layer 204 is disposed over the first center area 108 of each of the first tape 102. In a preferred embodiment, the horizontally non-conductive layer 204 comprises an anisotropic conductive film that is conductive in a vertical direction when pressure is applied in the vertical direction. In a preferred embodiment, the horizontally non-conductive layer 204 has a thickness ranging from 10 m to 50 m.

Figure 13:
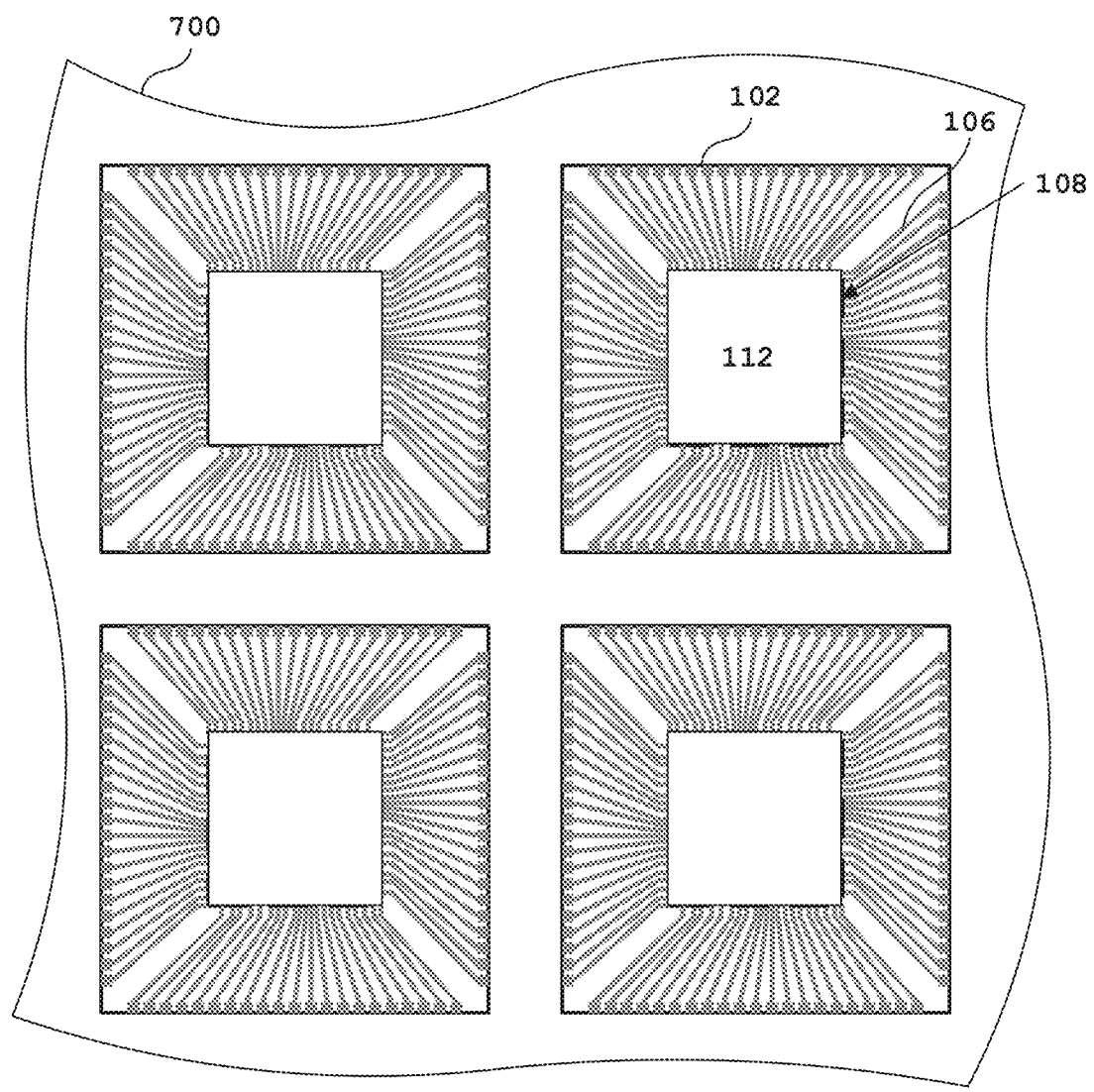

In the next step illustrated in FIG. 13, a first semiconductor die 112 is mounted over the first center area 108 of each of the first tape 102 and electrically connected to the plurality of bond pads 104 by way of a plurality of electrical contacts 114 and the horizontally non-conductive layer 204 that is only conductive in the vertical direction to electrically connect the plurality of bonding pads 104 to the plurality of electrical contacts 114. In a preferred embodiment, a metal plate 202 is further attached on a top surface of the first semiconductor die 112 to protect the first semiconductor die 112 from being bent.

Figure 14A:
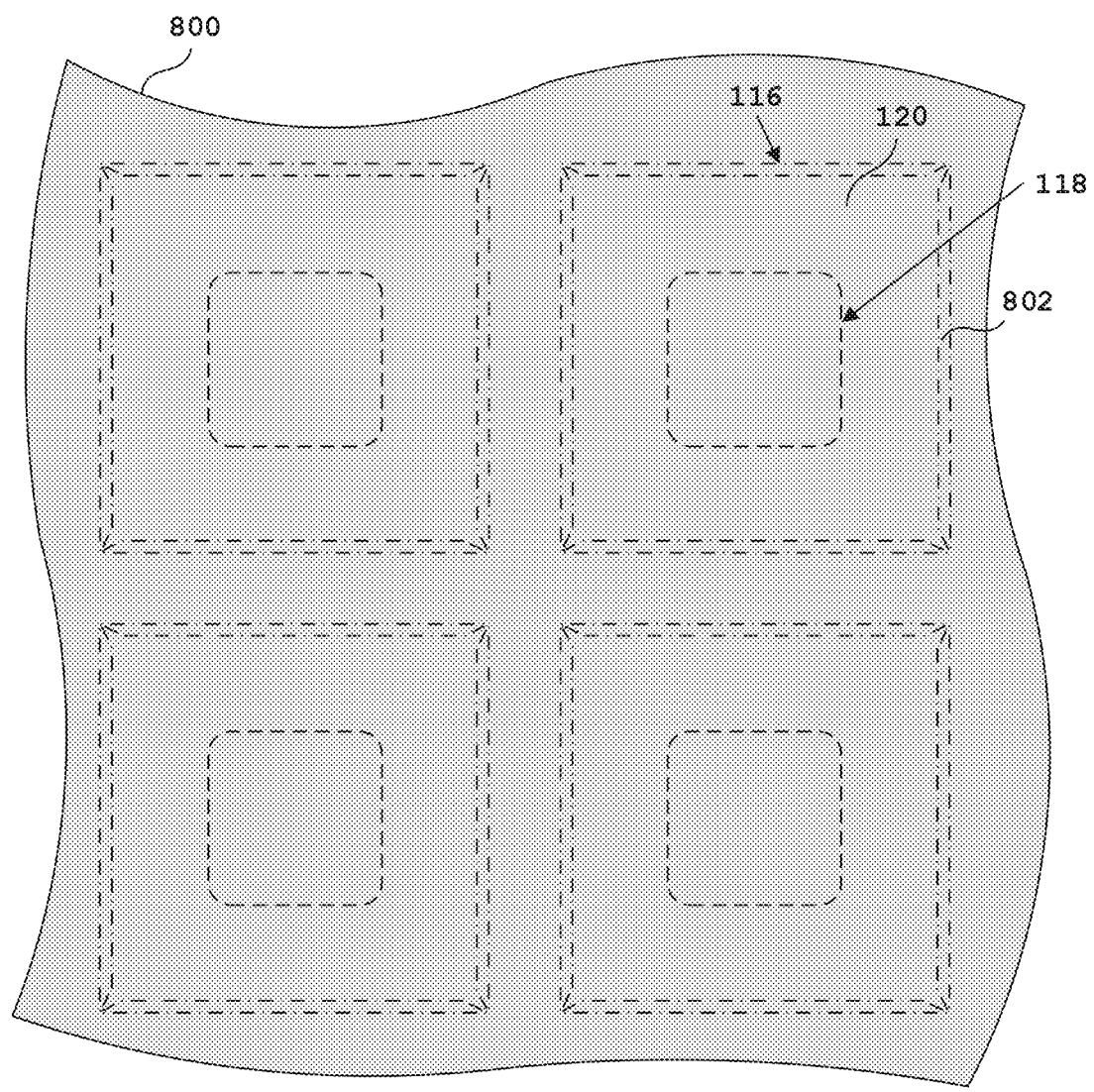
Figure 14B:
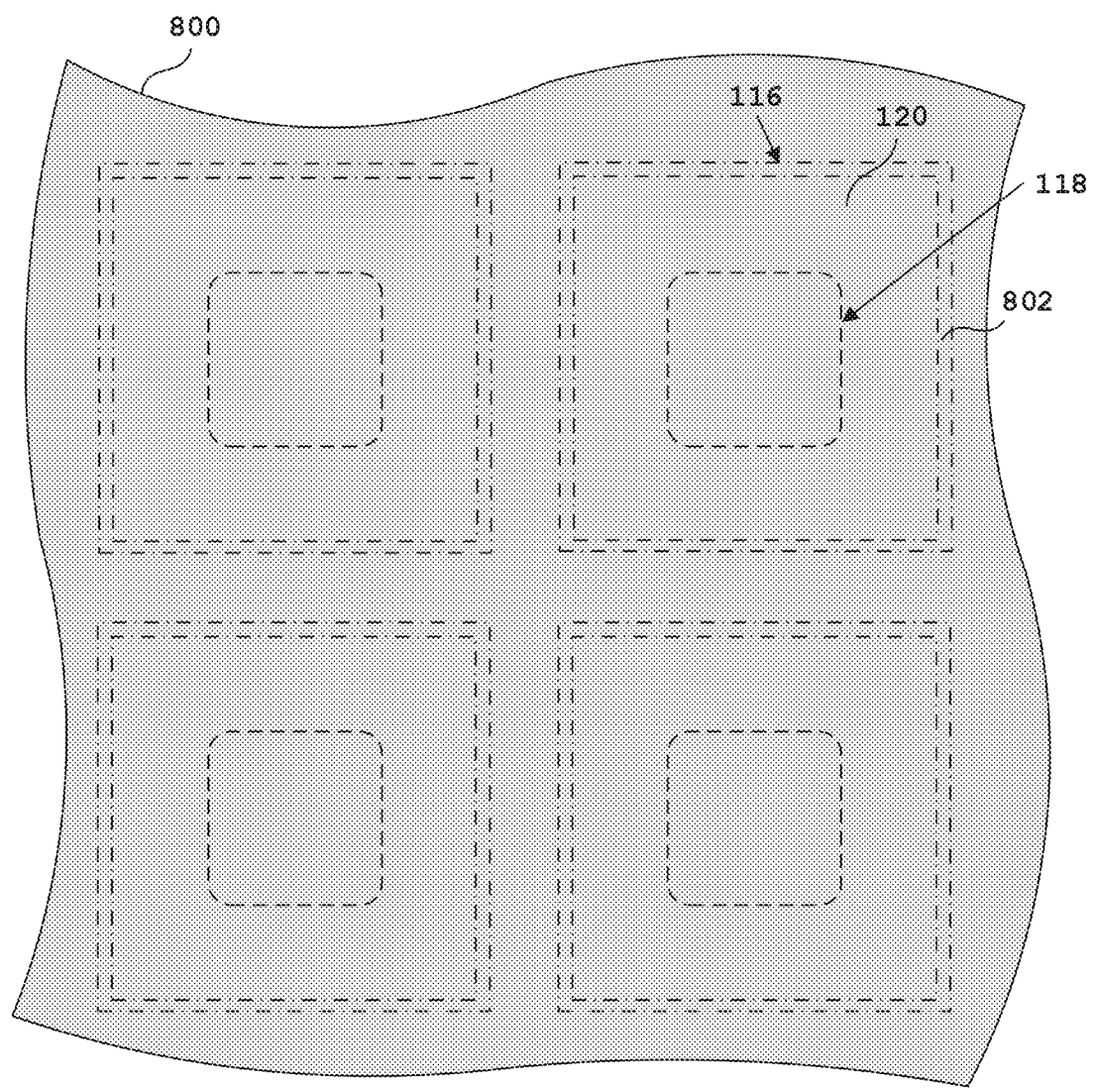

In the next step illustrated in FIGS. 14A and 14B, an array 800 of second tapes 116 is provided. In a preferred embodiment, the array 800 of the second tapes 116 is provided in a single piece of tape. Each second tape 116 includes a second center area 118 and a second peripheral area 120 surrounding the second center area 118. In a preferred embodiment, each second tape 116 further includes a pre-half-cut portion 802 that is to be peeled off, as shown in the dot dash line in FIG. 14A. In a preferred embodiment, the pre-half-cut portion 802 is located at least one side of the second tape 116. In another preferred embodiment, as shown in FIG. 14B, the pre-half-cut portion 802 is formed in a ring shape along a peripheral edge of the second tape 116.

Figure 15A:
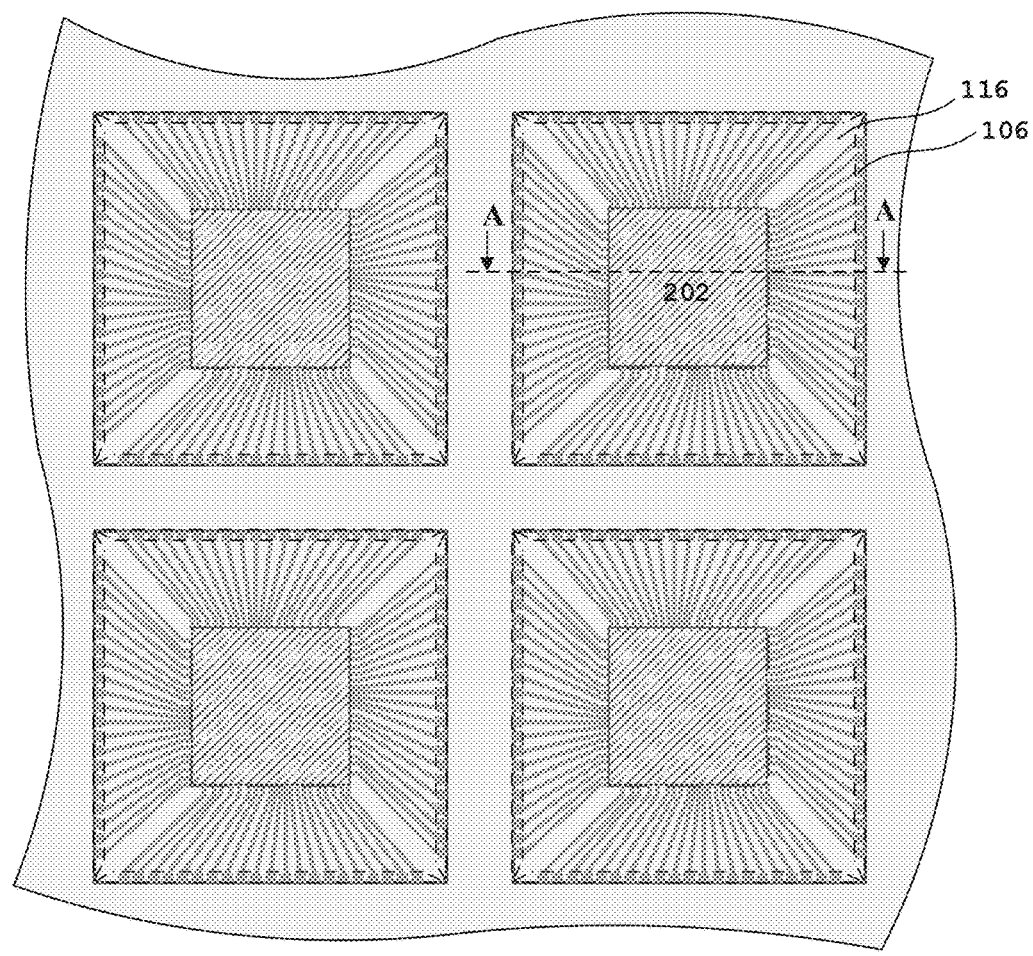
Figure 15B:
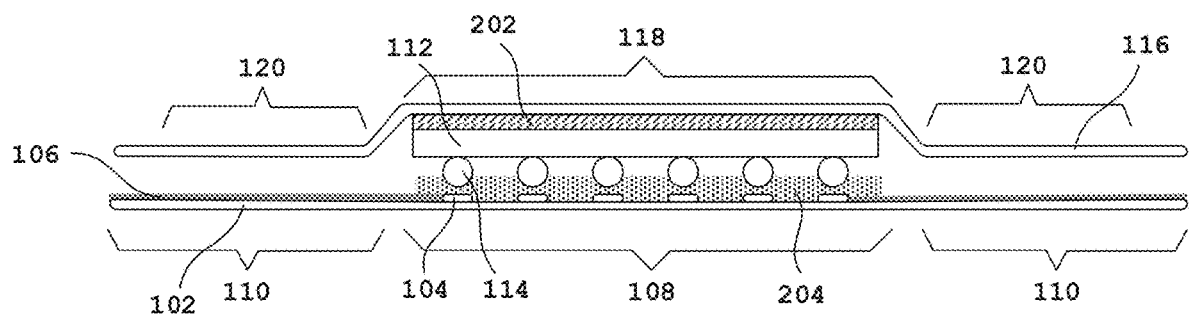

In the next step illustrated in FIG. 15A, the second tapes 116 are attached over corresponding first semiconductor dies 112. In a preferred embodiment, each the second tape 116 is attached to a corresponding metal plates 202 that is attached on a top surface of the first semiconductor die 112. FIG. 15B is a cross-sectional side view of FIG. 15A at line A-A, which shows that the second center area 118 of each second tape 116 is attached over a corresponding first semiconductor die 112, and the second peripheral area 120 of each second tape is attached to the first peripheral area 110 of each first tape 102. In a preferred embodiment, the metal plate 202 is disposed between the first semiconductor die 112 and the second tape 116. In another preferred embodiment, the metal plate 202 is embedded within the second center area 118 of the second tape 116 and exposed from the second tape 116 to achieve better heat dissipation.

Figure 16A:
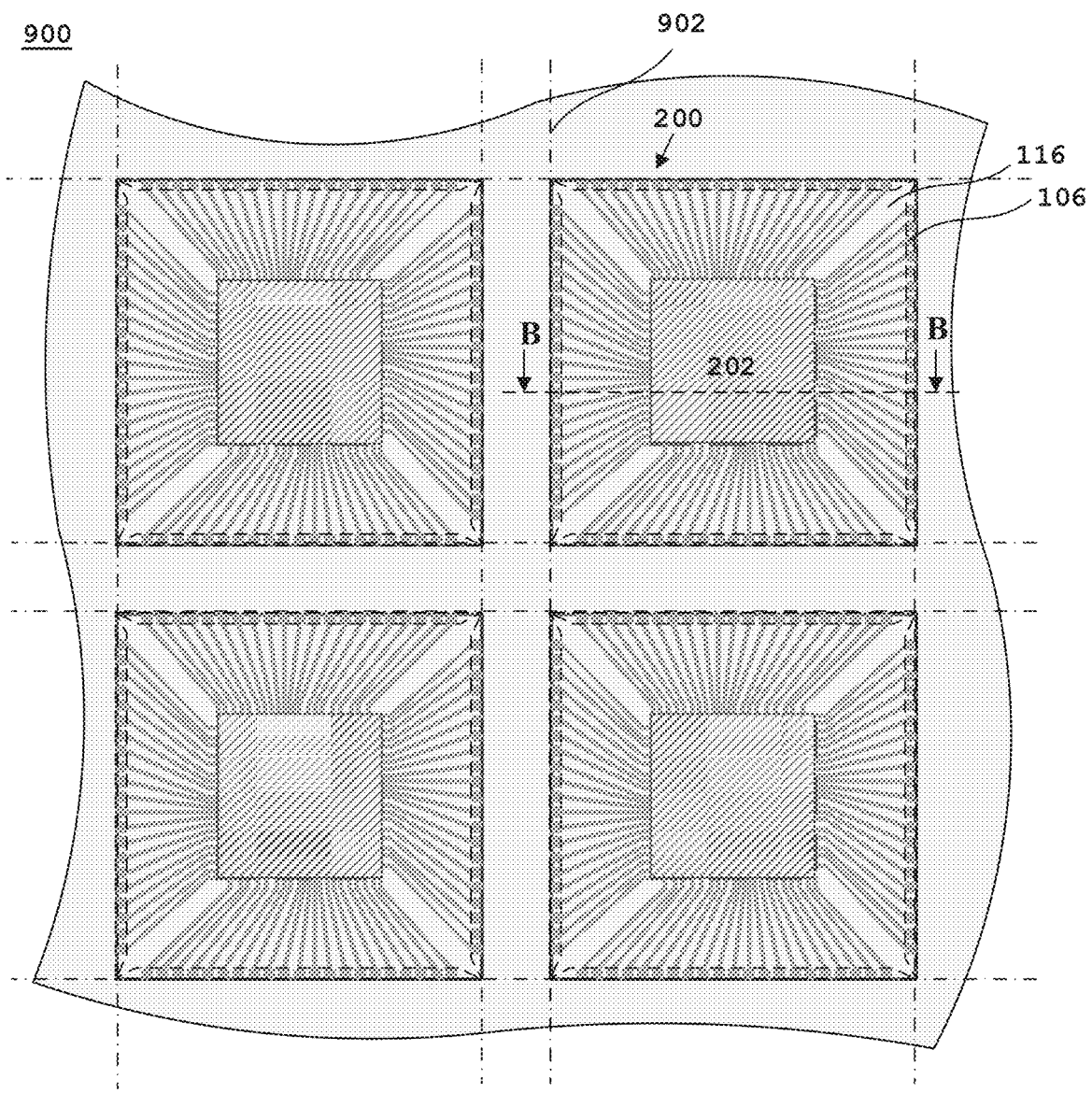
Figure 16B:
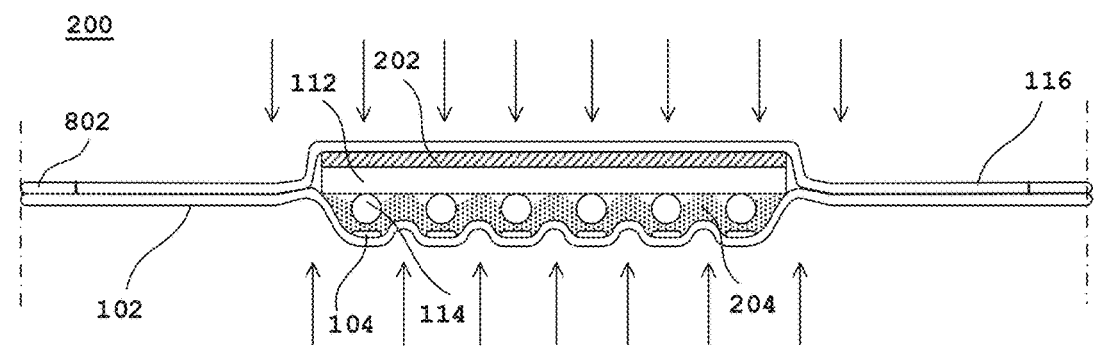
Figure 17:
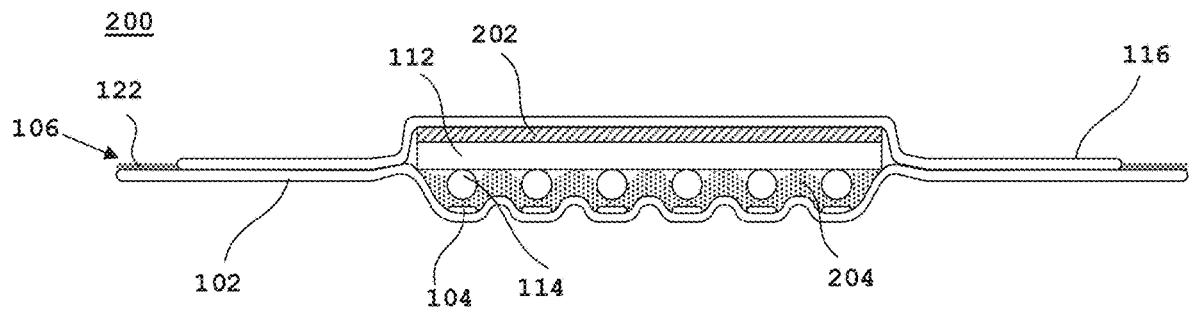

In the next step illustrated in FIG. 16A, a vacuum is applied between the first and second tapes 102 and 116 to draw the first and second tapes together, such that the first and second tapes 102 and 116 encapsulate the first semiconductor die 112, the metal plate 202, the plurality of electrical contacts 114, and at least a part of the plurality of conductive traces 106. In a preferred embodiment, the plurality of electrical contacts 114 are at least partially pressed into the horizontally non-conductive layer 204 by air pressure, such that the horizontally non-conductive layer 204 locks the plurality of electrical contacts 114 in place to prevent shifting between the plurality of electrical contacts 114 and the plurality of bonding pads 104. In a preferred embodiment, the first and second peripheral areas 110 and 120 are attached to each other by way of adhesive materials disposed therebetween. In another preferred embodiment, the first and second peripheral areas 110 and 120 are heated and attached to each other. An array 900 of a plurality of semiconductor devices 200 is formed after said encapsulation. Cutting is then performed along cutting lines 902 to singulate the semiconductor devices 200 in the array from each other. FIG. 16B is a cross-sectional side view of FIG. 16A at line B-B, which shows that a vacuum is applied between the first and second tapes 102 and 116 to draw the first and second tapes together, such that the first and second tapes 102 and 116 encapsulate the first semiconductor die 112, the metal plate 202, the plurality of electrical contacts 114, and at least a part of the plurality of conductive traces 106. In a preferred embodiment, the horizontally non-conductive layer 204 is cured to lock the plurality of electrical contacts 114 in place, such that horizontally non-conductive layer 204 prevents shifting between the plurality of electrical contacts 114 and the plurality of bond pads 104. The semiconductor device 200 is then singulated from the array by cutting long the cutting lines 902. The pre-half-cut portion 802 of the second tape 116 is peeled off to expose at least a portion of the conductive traces 106 to allow the exposed portion to act as an input and output terminal of the semiconductor device 200 as shown in FIG. 17. In a preferred embodiment, said peeling off is performed before said singulation.

Figure 18:
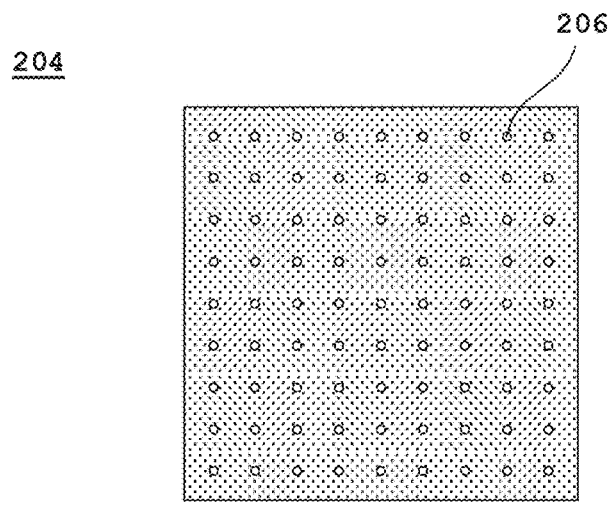
FIGS. 18-20 are a series of diagrams illustrating steps in assembling a flexible semiconductor device in accordance with another embodiment of the present invention.
Figure 19:
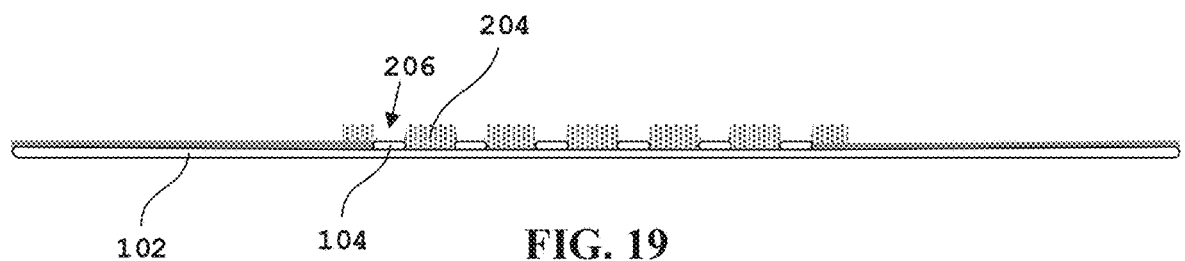
Figure 20:
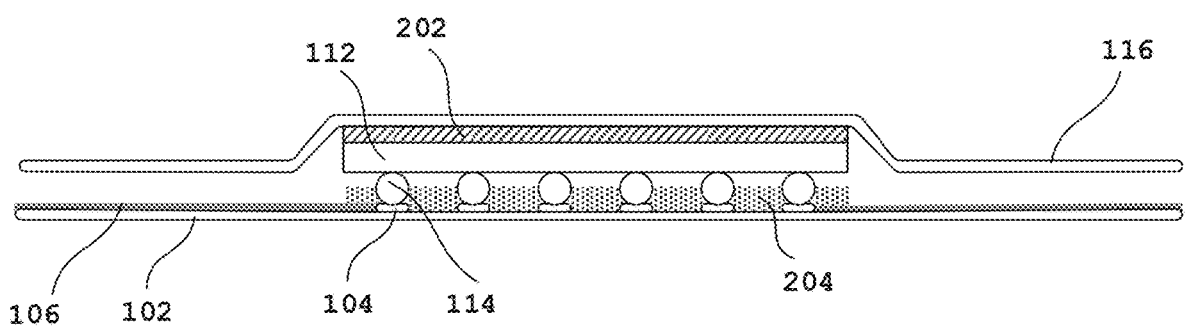

FIGS. 18-20 are a series of diagrams illustrating the steps in assembling or packaging a semiconductor device with the first tape 102 that has a plurality of bonding pads 104 and a plurality of conductive traces 106 formed thereon in accordance with another embodiment of the present invention. The plurality of bonding pads 104 are formed in a first center area 108 of the first tape 102, and the plurality of conductive traces 106 are formed in the first center area 108 and extend from the plurality of bonding pads 104 to a first peripheral area 110 that surrounds the first center area 108.

As shown in FIG. 18, in a preferred embodiment, the horizontally non-conductive layer 204 is provided with a plurality of openings 206. FIG. 19 shows a cross-sectional side view of the horizontally non-conductive layer 204 that is attached to the first tape 102. The plurality of openings 206 correspond to the plurality of bond pads 104, such that each of the plurality of bond pads 104 is exposed from the corresponding openings 206. In a preferred embodiment, the horizontally nonconductive layer 204 comprises adhesive materials such as Bstage epoxy that is disposed on the first tape-102 by screen printing process. The B-stage epoxy comprises epoxy resin, polyimide, Bismaleimide Triazine, etc.

In the next step illustrated in FIG. 20, the first semiconductor die 112 is mounted to the first tape 102 and electrically connected to the plurality of bond pads 104 by way of a plurality of electrical contacts 114, wherein the plurality of electrical contacts 114 are physically and electrically connected to the plurality of bond pads 104 through the plurality of openings 206 in the horizontally non-conductive layer 204. The first semiconductor die 112, the plurality of electrical contacts 114 and at least part of the conductive traces 106 are then encapsulated by the first and second tapes 102 and 116 by a vacuum applied therebetween as discussed above.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

What is claimed is:

1. A method for assembling a semiconductor device, the method comprising:
   providing a first tape that has a plurality of bonding pads and a plurality of conductive traces comprising graphene formed thereon, wherein the plurality of bonding pads are formed in a first center area of the first tape, and the plurality of conductive traces are electrically connected to and extend from respective bottom surfaces of the plurality of bonding pads to a first peripheral area surrounding the first center area;
   attaching a first semiconductor die to the first tape and electrically connecting the first die to the plurality of bond pads by way of a plurality of die electrical contacts; and
   attaching a second center area of a second tape to the first semiconductor die, and a second peripheral area surrounding the second center area of the second tape to the first peripheral area of the first tape by way of an adhesive therebetween, wherein the first and second tapes encapsulate the first semiconductor die, the plurality of die electrical contacts, and at least a part of the plurality of conductive traces.

2. The method of claim 1, further comprising:
   attaching a metal plate on a top surface of the first semiconductor die, wherein the metal plate is disposed between the first semiconductor die and the second tape.

3. The method of claim 1, further comprising:
   attaching a metal plate on a top surface of the first semiconductor die, wherein the metal plate is embedded in the second tape.

4. The method of claim 1, wherein the second tape comprises a metal plate embedded in the second center area and attached to a top surface of the first semiconductor die.

5. The method of claim 1, further comprising:
   forming a horizontally non-conductive layer at least partially over the first center area of the first tape; and
   curing the horizontally non-conductive layer, wherein the non-conductive layer locks the plurality of die electrical contacts in place.

6. The method of claim 5, wherein the horizontally non-conductive layer comprises an anisotropic conductive layer that is conductive in a vertical direction and non-conductive in a horizontal direction.

7. The method of claim 6, wherein the horizontally non-conductive layer is located between the first tape and the plurality of die electrical contacts and electrically connects the plurality of bond pads to the plurality of die electrical contacts.

8. The method of claim 5, wherein the horizontally non-conductive layer comprises a plurality of openings corresponding to the plurality of bond pads, wherein the plurality of die electrical contacts are physically and electrically connected to the plurality of bond pads through the plurality of openings.

9. The method of claim 1, further comprising applying a vacuum between the first and second tapes to draw the first and second tapes together.

10. The method of claim 1, further comprising peeling off a part of the second tape to expose a portion of at least one of the plurality of conductive traces to allow said exposed portion to act as an input and output terminal of the semiconductor device.

11. A method for assembling a semiconductor device, the method comprising:
    providing a first tape that has a plurality of bonding pads and a plurality of conductive traces formed thereon, wherein the plurality of bonding pads and the plurality of conductive traces comprise graphene, wherein the plurality of bonding pads are formed in a first center area of the first tape, and the plurality of conductive traces are electrically connected to and extend from respective bottom surfaces of the plurality of bonding pads to a first peripheral area surrounding the first center area;
    attaching a first semiconductor die to the first tape and electrically connecting the first die to the plurality of bond pads by way of a plurality of die electrical contacts; and
    attaching a second center area of a second tape to the first semiconductor die, and a second peripheral area surrounding the second center area of the second tape to the first peripheral area of the first tape by way of an adhesive therebetween, wherein the first and second tapes encapsulate the first semiconductor die, the plurality of die electrical contacts, and the plurality of conductive traces.

12. The method of claim 11, further comprising:
    attaching a metal plate on a top surface of the first semiconductor die, wherein the metal plate is disposed between the first semiconductor die and the second tape.

13. The method of claim 11, further comprising:
    attaching a metal plate on a top surface of the first semiconductor die, wherein the metal plate is embedded in the second tape.

14. The method of claim 11, wherein the second tape comprises a metal plate embedded in the second center area and attached to a top surface of the first semiconductor die.

15. The method of claim 11, further comprising applying a vacuum between the first and second tapes to draw the first and second tapes together.

16. The method of claim 11, further comprising peeling off a part of the second tape to expose a portion of at least one of the plurality of conductive traces to allow said exposed portion to act as an input and output terminal of the semiconductor device.

17. The method of claim 11, further comprising:
    forming a horizontally non-conductive layer at least partially over the first center area of the first tape; and
    curing the horizontally non-conductive layer, wherein the non-conductive layer locks the plurality of die electrical contacts in place.

18. The method of claim 17, wherein the horizontally non-conductive layer comprises a plurality of openings corresponding to the plurality of bond pads, wherein the plurality of die electrical contacts are physically and electrically connected to the plurality of bond pads through the plurality of openings.

19. The method of claim 17, wherein the horizontally non-conductive layer comprises an anisotropic conductive layer that is conductive in a vertical direction and non-conductive in a horizontal direction.

20. The method of claim 19, wherein the horizontally non-conductive layer is located between the first tape and the plurality of die electrical contacts and electrically connects the plurality of bond pads to the plurality of die electrical contacts.

\* \* \* \* \*